United States Patent
Leigh et al.

(10) Patent No.: US 9,306,302 B2
(45) Date of Patent: Apr. 5, 2016

(54) SOCKET WITH ROUTED CONTACTS

(75) Inventors: Kevin B. Leigh, Houston, TX (US); George D. Megason, Spring, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 14/391,359

(22) PCT Filed: Apr. 30, 2012

(86) PCT No.: PCT/US2012/035790
§ 371 (c)(1),
(2), (4) Date: Oct. 8, 2014

(87) PCT Pub. No.: WO2013/165352
PCT Pub. Date: Nov. 7, 2013

(65) Prior Publication Data
US 2015/0079815 A1    Mar. 19, 2015

(51) Int. Cl.
H01R 12/00 (2006.01)
H01R 12/71 (2011.01)
H01R 12/70 (2011.01)
H05K 7/10 (2006.01)
H05K 3/32 (2006.01)

(52) U.S. Cl.
CPC .......... H01R 12/712 (2013.01); H01R 12/7076 (2013.01); H05K 3/325 (2013.01); H05K 7/1092 (2013.01); H01R 12/714 (2013.01); H05K 2201/0311 (2013.01); H05K 2201/10325 (2013.01); H05K 2201/10378 (2013.01); H05K 2201/10734 (2013.01)

(58) Field of Classification Search
CPC ............ H01R 9/096; H01R 9/97; H01R 9/98; H01R 23/722; H05K 1/14; H05K 1/112; H05K 1/113; H05K 1/117

USPC .......................................... 439/74, 55, 65, 44
See application file for complete search history.

(56) References Cited

U.S. PATENT DOCUMENTS

| | | | |
|---|---|---|---|
| 6,469,908 B2 | 10/2002 | Patel et al. | |
| 7,641,481 B2 | 1/2010 | Trobough | |
| 7,911,057 B2 | 3/2011 | Nunn | |
| 8,018,738 B2 | 9/2011 | Doblar et al. | |
| 8,062,968 B1 | 11/2011 | Conn | |
| 8,955,215 B2 * | 2/2015 | Rathburn ........... | H01R 12/7082 174/254 |
| 2004/0017216 A1 | 1/2004 | Mardi et al. | |
| 2006/0186906 A1 | 8/2006 | Bottoms et al. | |
| 2010/0224971 A1 | 9/2010 | Li | |
| 2010/0244867 A1 | 9/2010 | Chong et al. | |
| 2011/0007483 A1 | 1/2011 | Li et al. | |
| 2012/0067637 A1 * | 3/2012 | Chow .................. | H05K 3/4092 174/261 |

OTHER PUBLICATIONS

International Searching Authority, The International Search Report and the Written Opinion, Dec. 28, 2012, 13 pages.

* cited by examiner

*Primary Examiner* — Vanessa Girardi
(74) *Attorney, Agent, or Firm* — Patent Law Office of David Millers

(57) ABSTRACT

A socket (130) employs a substrate (310) including a conductive network. As array of first contacts (136) is on a top surface of the substrate (310) and arranged to engage an integrated circuit (110). An array of second contacts (138) is on a bottom surface of the substrate (310) and arranged to engage a circuit board (120). The conductive network electrically connects the first contacts (136) respectively to the second contacts (138), and the first contacts (136) include a roused first contact (136') that the conductive network routes horizontally in or on the substrate (310).

10 Claims, 2 Drawing Sheets

SOCKET WITH ROUTED CONTACTS

BACKGROUND

A system employing a high pin-count integrated circuit such as a processor generally requires a printed circuit board (PCB) having high density electrical traces around the socket for the integrated circuit. Many times some of the traces in the PCB need to route signals that exit on one side of an integrated circuit to devices on the opposite side of the integrated circuit, and the PCB may need many layers to route traces that cross under the integrated circuit and socket. A high layer count for a PCB generally means high PCB cost, more signal integrity issues, and a longer design time. In particular, the high signal counts used for interfacing a processor with memory, IO devices, or other processors on a PCB such as the motherboard of a computer or server often require high trace congestion near the processor socket. The trace congestion in a PCB can similarly increases PCB and overall system cost, require a larger PCB and overall system, and create more signal integrity issues.

Use of the same inference symbols in different figures indicates similar or identical items.

DETAILED DESCRIPTION

A socket for a high pin-count integrated circuit (e.g., a processor or a network switch) can route signals from terminals of the integrated circuit (IC) to different areas of a printed circuit board (e.g., a motherboard). For example, a socket for an IC may include an interposer that routes signals between the IC terminal locations and printed circuit board (PCB) locations selected according to the design of the PCB on which the IC is used. The socket routing can thus reduce trace congestion in the PCB around the IC. Since the area around a socket typically has the greatest trace congestion, use of a socket with routed contacts may permit use of fewer layers in the PCB, and reduce overall system size and cost. Additionally, the socket with signal routings may route some signals to an external conductive media such as a flex connector instead of directly to the PCB, and the socket may further include an auxiliary chip such as a configuration EEPROM chip, which the IC or a management system, may use, for example, to identity the configuration of signal routings.

Figure 1:
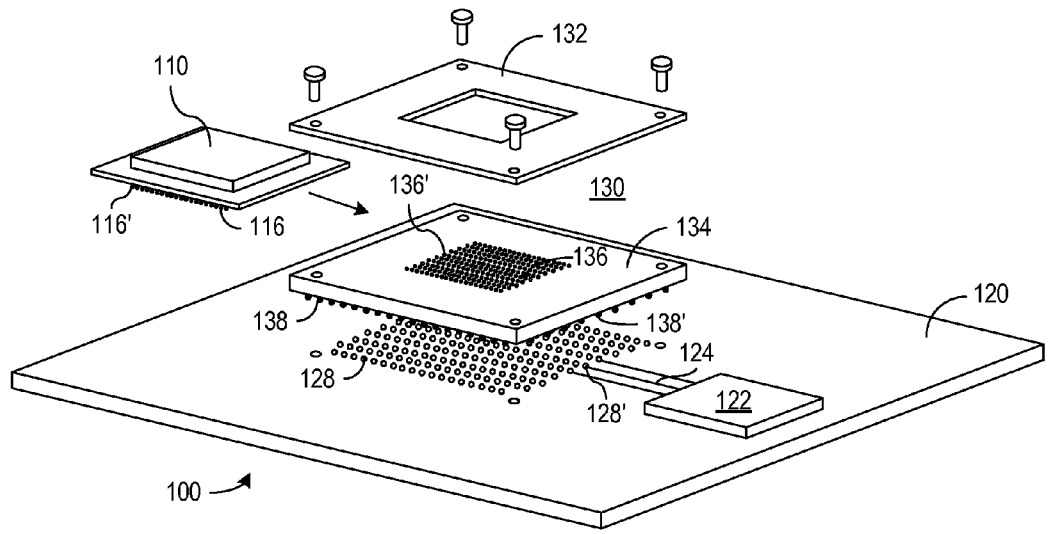
FIG. 1 shows an expanded view of a system including a socket with an interposer that routes signals according to the circuitry on a circuit board.

FIG. 1 shows an expanded view of a system 100 including an IC 110 that is socket-mounted on a circuit board 120. IC 110 may, for example, be a processor, and circuit board 120 may be a motherboard or a computer that includes other devices or ICs 122 that communicate with the processor through electrically conductive traces 124 formed in and on circuit board 120. IC 110 generally includes packaging, e.g., flip-chip packaging, that provides IC 110 with an array of pins or terminals 116 for electrical connections. IC 110 may be mounted in a socket 130 that includes a retaining structure 132 and an interposer 134. Retaining structure 132 may include a mechanical system such as a cavity in which an IC fits and a retention chip or a lever system for holding IC 110 in place. Retention structure 132 may further provide for attachment of a heat sink (not shown). Retention structure 132 can encase interposer 134 within socket 130, but socket 130 and interposer 134 may be larger than IC 110 to provide space for traces or routings that as described further may extend beyond the boundaries of IC 110.

Interposer 134 includes an array of top contacts 136 that make electrical connections to respective terminals 116 of IC 110, an array of bottom contacts 138 that make electrical connections to respective pads 128 in an array on circuit board 120, and a conductive network of vias, traces, or other electrical routings that connect top contacts 136 to bottom contacts 138. Socket 130 and circuit board 120 further include features (not shown) for mechanical alignment of socket 130 to circuit board 120, mechanical alignment of IC 110 to interposer 134, and mechanical alignment of a heat extraction device.

One function of socket 130 is to hold IC 110 and route signals vertically between IC 110 and circuit board 120, but socket 130 also horizontally routes at least some signals from IC 110. In particular, top contacts 136 include one or more "routed top contacts" which are top contacts 136 that are electrically connected through routing in socket 130 to respective bottom contacts 138 that are horizontally offset from the routed top contacts. Top contacts 136 may additionally include one or more unrouted top contacts 136, which are top contacts 136 that are electrically connected to respective bottom contacts 138 that directly below the unrouted top contacts. For example, IC 110 may have a terminal 116' near one edge of IC 110 for a signal used in communication with a device 122 on PCB 120 nearest to an opposite edge of IC 110. The array of top contacts 136 on interposer 134 may match the pattern of and respectively contact the array of terminals 116. The array of top contacts 136 particularly includes a routed top contact 136' that makes electrical contact to terminal 116'. Electrically conductive traces or other electrical routing in or on interposer 134 electrically connects routed top contact 136' to a routed bottom contact 138' that is horizontally offset from top contact 136', e.g., routed bottom contact 138' may be nearest to an edge of IC 110 opposite to the edge nearest to terminal 116'. Routed bottom contact 138' can then contact a pad 128' that is connected to a trace or other electrical routing 124 providing a relatively direct path to device 122. Accordingly, if necessary for a particular PCB design, interposer 134 can route signals from one side of IC 110 to the other and reduce the congestion of traces 124 in PCB 120 near socket 130.

Top contacts 136 as noted above can be arranged in a pattern matching the pattern of terminals 116 on IC 110. Bottom contacts 138 can be arranged in a pattern matching the pattern of pads 128 on circuit board 120. With routing as described above, the pattern of bottom contacts 138 in system 100 may differ from the pattern of top contacts 136 in that at least some of top contacts 136 are not directly connected to corresponding bottom contacts 138 by vertical conductive vias. More generally, the pattern of bottom contacts 138 may include a scaling to a larger pitch or contact size than used for contacts 136 or may be different from the pattern of contacts. Further, regardless of the patterns of contacts 136 and 138, the ordering of individual contacts or signals in the array of bottom contacts 138 may be different from the ordering of contacts or signals in the array of top contacts 136. In particular, top contacts 136 that are adjacent to each other may respectively be connected to bottom contacts 138 that are not adjacent.

Figure 2:
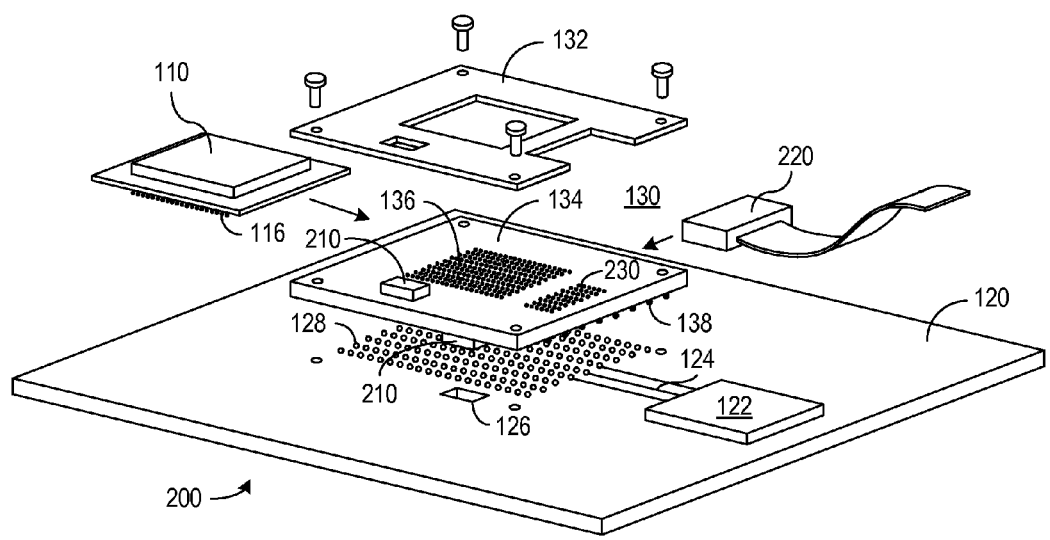
FIG. 2 shows an expanded view of a system including a socket with an interposer that routes signals to a circuit board, a flex connector, and an auxiliary device that is part of the socket.

Routing of signals in socket 130 is not limited to routings between top terminals 136 and bottom terminals 138. FIG. 2, for example, shows a system 200 using an implementation of socket 130 and interposer 134 that provides routings between terminals 116 of IC 110 and circuit board 120, auxiliary chips 210, and a flex connector 220. As noted above, socket 130 and interposer 134 may be larger than IC 110 so that signal routes in interposer 134 can escape outside the footprint of IC 110 and outside the main chip cavity of socket 110. Interposer 134 can also be shaped in a way such that all or a large portion of interposer 134 is within the case or retaining structure 132 of socket 130, but part of interposer 134 can be outside the case or retaining structure 132 of socket 130. For example, the shape of retaining structure 132 may permit connection of flex connector 220 or other media to traces, pads, or contacts 230 on the top surface of interposer 134. Contacts 230 may, for example, be spring contacts that are similar or identical to contacts 136. Flex connector 220 and associated wiring, e.g., flexible flat cables, can connect socket 130 to devices on circuit board 120 or elsewhere. Mechanical retention structure 132 may secure exposed portions of interposer 134, e.g., the portion including contacts 230.

Socket 130 in the implementation of FIG. 2 also includes one or more auxiliary chips 210. Auxiliary chips 210 may include a NVM, a non-volatile memory such as an EEPROM, that stores information, regarding the configuration of socket 130, circuit board 120, or other connections to socket 130. Interposer 134 can easily gather power from the connections to IC 110 to power the auxiliary chips 210. A configuration EEPROM can contain information indicating trace topology, and the attributes of other auxiliary chips. Another type of auxiliary chip 210 on interposer 134 may interface to system management signals (that are outside of IC 110). Auxiliary chips 210 may also or alternatively interface to IC 110. One use of auxiliary chips 210 is to provide information that enables IC 110 to make necessary adjustment, for example, to configure its transmitter/receiver interfaces. Auxiliary chips 210 may include non-volatile memory preprogrammed during the manufacturing of interposer 134 to store trace information. Additionally, a system management controller (not shown) for circuit board 120 may also read configuration information from the auxiliary chips 210, and write system level information in auxiliary chips 210 to enable IC 110 to make adjustments that may depend on information, e.g., trace information, associated with both interposer 134 and circuit board 120. Auxiliary chips 210 could also include active circuits or chips such as E/O engines (i.e., electrical-optical signal converters).

Socket 130 can be shaped in a way to use the same heat sink for IC 110 and auxiliary chips 210. Alternatively and if necessary, separate heat sinks (not shown) can be used to cool auxiliary chips 210 on the same side of interposer 134 as IC 110. Some auxiliary chips 210 may be top mounted, i.e., on the same side of interconnector 134 as IC 110. Some other auxiliary chips 210 may be bottom mounted, i.e., on the side of interposer 134 opposite from IC 110. Interposer 134 may be larger than the pattern area of pads 128, and circuit board 120 may have a void 126 for the bottom-mounted auxiliary chips 210, and their corresponding heat sinks (not shown) to protrude through circuit board 120. Further, the top-mounted or bottom-mounted auxiliary chips 210 including E/O engines may be aligned with windows or voids 120 in circuit board 120, so that optical signals can be transmitted, for example, through voids 126, between the E/O engines and electro-optical devices that may be on another circuit board (not shown).

Figure 3A:
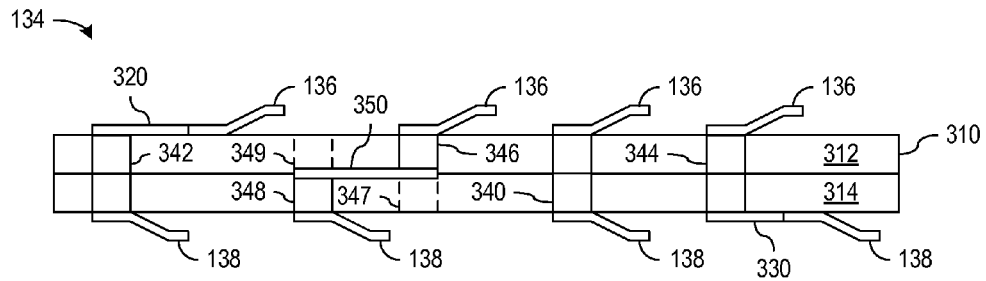
FIGS. 3A and 3B show cross-sectional views illustrating alternative contacts on socket interposers providing horizontal routing of integrated circuit pins.

Interposer 134 in the implementation, of FIG. 1 or 2 can be constructed using techniques and materials that are similar to those used in current IC sockets, e.g., processor sockets. FIG. 3A shows a cross-section illustrating one example of the construction of interposer 134 in which top and bottom contacts 136 and 138 are respectively in top and bottom surfaces of a substrate 310 and electrically interconnected through a network of traces and vias in and on substrate 310. Interposer 134 in FIG. 3A has top contacts 136 to interface with an IC such as a processor and bottom contacts 138 to be pressure mated with the pads on a circuit board such as a computer motherboard. When a processor or other IC is placed in the socket, the IC sits directly on interposer 134, so that interposer 134 intercepts the signals to be routed between the IC and the outside of the socket cavity area. In the example of FIG. 3A, top contacts 136 are spring contacts formed using cantilevered metal (e.g., copper) strips shaped to deflect when a retaining structure presses the terminals of the IC against top contacts 136. Similarly, bottom contacts 138 in FIG. 3A are spring contacts formed from metal strips shaped to compress against pads on a circuit board when a retaining force is applied. Metal traces or other electrical routings 320 and 330 are also or the top and bottom surfaces of substrate 310 and may be formed of the same material as or a different material from the material of contacts 136 and 138. Either or both of metal traces 320 and 330 may be patterned to conduct signals horizontally along the top or bottom surface of substrate 310. For example, traces 320 may conduct signals horizontally along the top surface of substrate 310 between a top contact 136 and a conductive through-hole via 342 through substrate 310, and traces 330 may conduct signals horizontally along the bottom surface of substrate 310 between a bottom contact 138 and a conductive through-hole via 344 through substrate 310.

Substrate 310 can be made using one or more layers of a dielectric or insulating material such as FR4 with conductive vias 340, 342, and 344, e.g., copper plated through holes in substrate 310. FIG. 3A illustrates an example in which substrate 310 is a multilayer structure including multiple dielectric or insulating layers 312 and 314 and one or more internal conductive layers patterned to form conductive traces or electrical routings 350. Internal conductive traces 350 may, for example, conduct electrical signals horizontally between a conductive blind via 346 passing through upper insulating layer 312 and a conductive blind via 348 passing through lower insulating layer 314. For ease of fabrication, either or both of blind vias 346 and 348 could alternatively be through-hole vias that include respective portions 347 and 349. Internal traces 350 provide additional routing freedom for crossing signal paths but may be unnecessary in some sockets 130 that route signals as described herein.

Figure 3B:
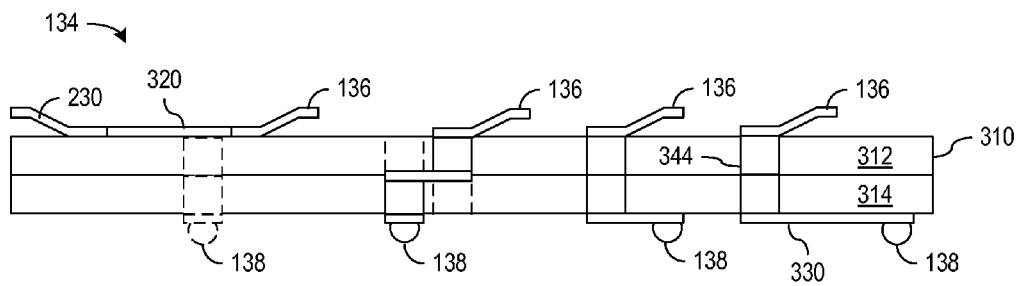

FIG. 3A illustrates an example of a socket interposer 134 using cantilever springs in both top and bottom contacts 136 and 138. However, other types of contacts can be used for either top or bottom contacts. Several alternative types of spring contacts, for example, single-beam or dual-beam, could be employed for top or bottom contacts 136 or 138. Non-spring contacts could also be employed. For example, FIG. 3B illustrates an example of interposer 134 in which bottom contacts 138 include solder balls that a reflow process may attach to pads on a circuit board. Spring-type contacts may be desired in a socket for easy installation and removal of an IC. FIG. 3B also illustrates how a top contact 136, instead of or in addition to being connected to a bottom contact 138, may be routed, e.g., using top traces 320, to contacts 230 intended for connection to conductive media such as a flex connector or flexible flat cable.

Figure 4:
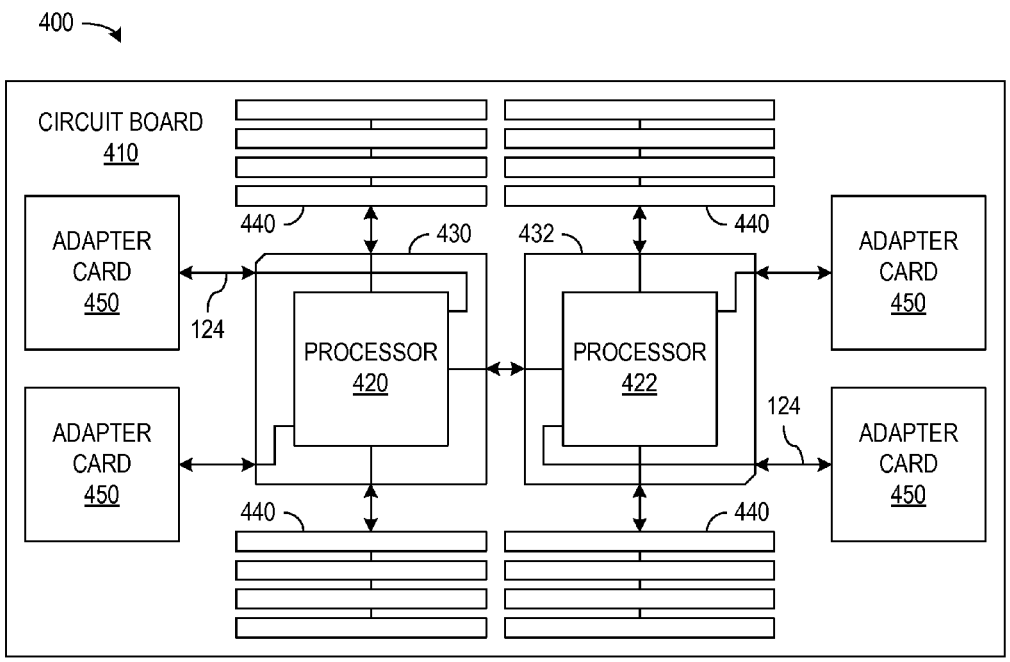
FIG. 4 is a block diagram of a multi-processor motherboard using routing sockets to reduce the congestion of traces in the motherboard adjacent to the routing sockets.

FIG. 4 shows an example of a dual-processor server system 400 using a motherboard 410 with two processors 420 and 422 in respective routing sockets 430 and 432. The I/O pin pattern and signal assignment for processors are generally fixed for a type of processor, and an IC designer or layout system may have chosen the pin pattern and signal assignment based on a variety of goals such as optimizing processor performance and convenience of use of the processor in a specific or typical application. For many current processors, these signals may include processor-to-processor links, processor-to-memory links and processor-to-IO links, e.g., PCI Express signals. FIG. 4 shows a configuration where processors 420 and 422 are oriented for most efficient communication with each other. In particular, processors 420 and 422 may be substantially identical to each other, and socket 432 may be rotated by 180° relative to socket 430 so that terminals for processor-to-processor signals are nearest the adjacent edges of processor 420 and 422. In this configuration, currently popular, general-purpose microprocessors may have some of the PCI Express signals associated with pins nearest the edges between the two processors 420 and 422. For the layout of circuit board 410, these trapped PCI Express signals from each processor 420 or 422 need to be routed from near the edge facing the other processor 422 or 420 back to adapter cards 450 nearest to the opposite edge of the processor 420 or 422. Processors also have other high trace count interlaces such as processor-to-processor and DDR memory interfaces, which may need to access other devices such as memory 440. Routing the trapped PCI Express traces within the motherboard PCB layers and across processor 420 or 422 would require high PCB layer count and/or larger PCB size, and consequently higher PCB cost. However, routing sockets 430 and 432 can route signals from one edge of a processor 420 to the other edge allowing for use of fewer layers in PCB 410. For system 400 of FIG. 4, sockets 430 and 432 may be rotated relative to each other but may be otherwise identical if the processor connections to circuit board 410 are symmetric. Alternatively, sockets 430 and 432 may be different, e.g., have different conductive networks or different bottom contact patterns even when processors 420 and 422 are identical.

Although the invention has been described with reference to particular embodiments, the description is only an example of the invention's application and should not be taken as a limitation. Various adaptations and combinations of features of the embodiments disclosed are within the scope of the invention as defined by the following claims.

What is claimed is:

1. A socket comprising:
a substrate including an insulating material and a conductive network;
an array of first contacts on a top surface of the substrate and arranged to engage an integrated circuit;
an array of second contacts on a bottom surface of the substrate and arranged to engage a circuit board;
an array of third contacts on a too surface of the substrate and arranged to engage conductive media; and
a flex connector comprising a flexible cable connected to the third contacts; wherein:

the conductive network electrically connects the first contacts respectively to the second contacts; and
the first contacts include a routed first contact that the conductive network routes horizontally in or on the substrate.

2. The socket of claim 1, wherein the conductive network comprises:
a conductive via that extends vertically in the substrate and is horizontally offset from the routed first contact; and
top traces that are on the top surface of the substrate and connect the routed first contact to the conductive via.

3. The socket of claim 1, wherein the first contacts or the second contacts are spring contacts and compress in response to the integrated circuit engaging an interposer.

4. The socket of claim 1, wherein the first contacts include an unrouted first contact that the conductive network directly routes vertically to an unrouted second contact among the second contacts.

5. The socket of claim 1, wherein the network connects the routed first contact to a routed second contact that is one of the second contacts and is horizontally offset from the routed first contact.

6. The socket of claim 5, wherein the conductive network comprises:
a conductive via that extends vertically in the substrate and is horizontally offset from the routed second contact; and
bottom traces that are on the bottom surface of the substrate and connect the routed second contact to the conductive via.

7. The socket of claim 5, wherein the conductive network comprises:
a first conductive via that extends vertically in the substrate and is electrically connected to the routed first contacts;
a second conductive via that is horizontally offset from the first conductive via, extends vertically in the substrate, and is electrically connected to the routed second contact; and
internal traces that electrically connect the first conductive via and the second conductive via inside the substrate.

8. A socket, comprising:
a substrate including an insulating material and a conductive network;
an array of first contacts on a top surface of the substrate and arranged to engage an integrated circuit;
an array of second contacts on a bottom surface of the substrate and arranged to engage a circuit board; and
an auxiliary chip that is mounted on the substrate, and accessible through the first contacts or second contacts; wherein:
the conductive network electrically connects the first contacts respectively to the second contacts;
the first contacts include a routed first contact that the conductive network routes horizontally in or on the substrate; and
the auxiliary chip is aligned for communication via optical signals passing through a void in the circuit board.

9. The socket of claim 8, wherein the auxiliary chip stores configuration information.

10. The socket of claim 8, wherein the auxiliary chip comprises electrical-optical signal converters.

* * * * *